United States Patent [19]
Götz et al.

[11] Patent Number: 4,985,845
[45] Date of Patent: Jan. 15, 1991

[54] MODULAR ELECTRICAL CONTROL DISTRIBUTION SYSTEM

[75] Inventors: Eckart Götz; Hans-Reter Lerch, both of Erbach; Thomas Dörsam, Birkenau; Gerhard Schweigert, Darmstadt; Werner Wittmann, Erbach; Michael Korner, Reinheim, all of Fed. Rep. of Germany

[73] Assignee: Robert Bosch GmbH, Stuttgart, Fed. Rep. of Germany

[21] Appl. No.: 293,637

[22] Filed: Jan. 5, 1989

[30] Foreign Application Priority Data

Jan. 5, 1988 [DE] Fed. Rep. of Germany ....... 3800077

[51] Int. Cl.$^5$ .................. G06F 13/00; G08C 25/00; H05K 5/00
[52] U.S. Cl. ................................ 364/492; 361/394; 361/399; 439/928
[58] Field of Search ............ 364/550, 551.01, 492; 361/383–393, 394, 399; 439/271, 485, 928

[56] References Cited

U.S. PATENT DOCUMENTS

| | | | |
|---|---|---|---|
| 4,152,750 | 5/1979 | Bremenour et al. | 361/383 |
| 4,215,386 | 7/1980 | Prager et al. | 361/394 |
| 4,336,610 | 6/1982 | Steiner | 370/15 |
| 4,401,351 | 8/1983 | Record | 439/928 |
| 4,432,064 | 2/1984 | Barker et al. | 364/550 |
| 4,477,862 | 10/1984 | Gonzales | 361/393 |
| 4,545,632 | 10/1985 | Maier | 439/43 |
| 4,558,914 | 12/1985 | Prager | 361/393 |
| 4,593,380 | 6/1986 | Kocher | 364/900 |
| 4,599,680 | 7/1986 | Gibson et al. | 361/386 |
| 4,660,126 | 4/1987 | Köster et al. | 361/392 |
| 4,738,632 | 4/1988 | Schmidt | 439/341 |
| 4,764,868 | 8/1988 | Ketelhut et al. | 364/200 |
| 4,796,159 | 1/1989 | Miksche et al. | 361/393 |
| 4,870,564 | 9/1989 | Ketelhut et al. | 364/200 |

FOREIGN PATENT DOCUMENTS

| | | | |
|---|---|---|---|
| 2657260 | 7/1978 | Fed. Rep. of Germany | 361/393 |
| 2753145 | 6/1979 | Fed. Rep. of Germany | . |
| 2904012 | 8/1980 | Fed. Rep. of Germany | . |
| 3519807 | 12/1985 | Fed. Rep. of Germany | . |
| 3440025 | 5/1986 | Fed. Rep. of Germany | . |
| 3619835 | 12/1987 | Fed. Rep. of Germany | . |

Primary Examiner—Felix D. Gruber
Attorney, Agent, or Firm—Frishauf, Holtz, Goodman & Woodward

[57] ABSTRACT

In order to control large machines or plants, it is necessary to connect an electronic control 8' or Central Processing Unit (CPU) with a number of reporting, positioning, and measuring peripherals. This CPU is usually not in the immediate vicinity of the peripherals. In order to obviate the need to run separate lines from each of three connected devices to the CPU, an input/output system is connected to the CPU by a data bus for transmission of signals in both directions. An input/output system is often exposed to dust, cuttings, and/or moisture generated at the machine or installation, so the present invention features dust-and-water-resistant seals 5, 17, 26, 28, 52 at all sockets. A plug distribution box 1 with sockets 7, 8, 9 for power supply, bus, and diagnostic connections can be extended by input/output modules 2 which plug into box 1. The modules 2 in turn have sockets 21 for connection with reporting, positioning, and measuring units.

34 Claims, 4 Drawing Sheets

MODULAR ELECTRICAL CONTROL DISTRIBUTION SYSTEM

Cross-reference to related patent documents, the disclosures of which are hereby incorporated by reference:

U.S. Pat. No. 4,401,351, RECORD/ADVANT CORP.

U.S. Pat. No. 4,477,862, GONZALES/GOULD, INC.

U.S. Pat. No. 4,558,914, PRAGER & GONZALES/GOULD, INC.

U.S. Pat. No. 4,870,564, Ketelhut et al

U.S. Pat. No. 4,764,868, Ketelhut et al, to both of which German OS 35 19 807, correspond.

U.S. Pat. No. 4,545,632, MAIER/BOSCH, corresponding to German DE-OS 32 43 727.

German DE-OS 27 53 145, JAKOB/BOSCH, published Jun. 7, 1979.

U.S. Pat. No. 4,593,380, GAREIS et al./GENERAL ELECTRIC, corresponding to German DE-OS 35 19 826.

U.S. Pat. No. 4,336,610, STEINER/SIEMENS;

U.S. Pat. No. 4,738,632, MEUSEL, SCHIRBL, & SCHMIDT;

European Patent Application Publication 0 236 711, SCHMIDT et al./SIEMENS, published Sep. 16,1987;

German DE-OS 29 04 012, LEPPERT/SIEMENS, published Aug. 7, 1980.

German DE-OS 34 40 025, CHWIERALSKY et al./PULSOTRONIC, published May 7, 1986.

German DE-OS 36 19 835, MARZLUF, published Dec. 17, 1987.

FIELD OF THE INVENTION

The present invention relates generally to modular electrical control systems, and, more particularly, to an improved system which is adapted for hostile environments, including dust and/or high humidity, such as those often found where electronically controlled machinery is installed.

BACKGROUND

In order to control large machines or plants, it is necessary to connect an electronic control or Central Processing Unit (CPU) with a number of reporting, positioning and measuring peripherals. This CPU is usually not in the immediate vicinity of the peripherals. In order to obviate the need to run separate lines from each of these connected devices to the CPU, it is known to provide, in the immediate vicinity of the machine or controlled device, one or more electronic input/output systems, which are connected to the CPU by a data bus for transmission of signals in both directions. Such systems are disclosed in U.S. Pat. Nos. 4,870,564 and 4,764,868, both Ketelhut et al, to which German Patent Disclosure Document DE-OS 35 19 807 corresponds.

In general, electronic controls are located outside the range of influence of dust, cuttings, and/or moisture generated at the machine or installation. An input/output system is, however, often exposed to such influences, and/or must be located in a hard-to-access location.

Therefore, an input/output system must be enclosed in a housing which is made resistant to dust and/or water. Into this housing are fed the large number of connectors for the reporting, positioning, and measuring units, and the power supply lines for the input/output system. Generally, all these equipment elements, arranged on or in the machine or installation, are subjected to harsh environmental conditions, so the most frequent errors or faults occur at these elements. In order to recognize and localize these faults in a timely manner, it is necessary to provide circuits which enable monitoring and supervision of all these connections and/or the operation of the reporting, positioning, and measuring units, e.g. as disclosed in U.S. Pat. No. 4,593,380, GAREIS et al./GENERAL ELECTRIC, corresponding to German DE-OS 35 19 826, and DE-OS 34 40 025 (CHWIERALSKY et al./PULSOTRONIC). In case of trouble, generally the source of the fault, and, in part, the type of fault, e.g. loose connection, short-circuit, or faulty operation, are displayed.

In spite of these aids, the actual error correction is difficult in many cases, since the fault location may not be unambiguously identified, and the replacement of individual reporting, positioning, or measuring units or their connections to the input/output system is not only laborious, but can only be carried out by specially trained experts. This is the case, above all, when a fault determination or fault correction in the input/output system must be carried out, or when it is necessary to replace a reporting, positioning, or measuring unit and its connecting lines to the system.

THE INVENTION

It is an object of the invention to facilitate and simplify fault correction and/or fault identification. It is a further object to provide an input/output system which can easily be adapted to very differently constructed machines or installations.

Briefly, a decentralized group of modular elements are connected to an environmentally protected plug-in, input/output (I/O) unit which includes a logic element and receives signals from a control unit, such as a CPU.

This modular arrangement has substantial advantages relating to fault identification, fault correction, and arrangement on the machine or installation. The structure of the invention is dust-tight and/or water-tight, so it is possible to make the individual elements of the input/output group without an additional housing and directly accessible. The substitution of individual components thus becomes very simple, and can take place without substantial expenditure of time.

If, for example, a fault is indicated in one of the reporting, positioning, or measuring units, the fault can be easily verified by pulling the correspondingly indicated plug, and the defective element, together with the associated conductors, can be replaced by semi-skilled personnel. This applies, above all, to such reporting, positioning, or measuring units which, due to their hostile environment, are completely sealed, e.g. potted with their connectors or connecting cables. Thus, a rapid fault correction, possibly also with the aid of the correspondingly summoned attendant, can significantly reduce the downtime of the machine or installation.

Plugging in additional or different input/ouput modules makes possible a simple matching of the control system to the machine or installation. Further advantages of the input/output system structure of the present invention will be apparent from the following detailed description.

DETAILED DESCRIPTION

Figure 1:
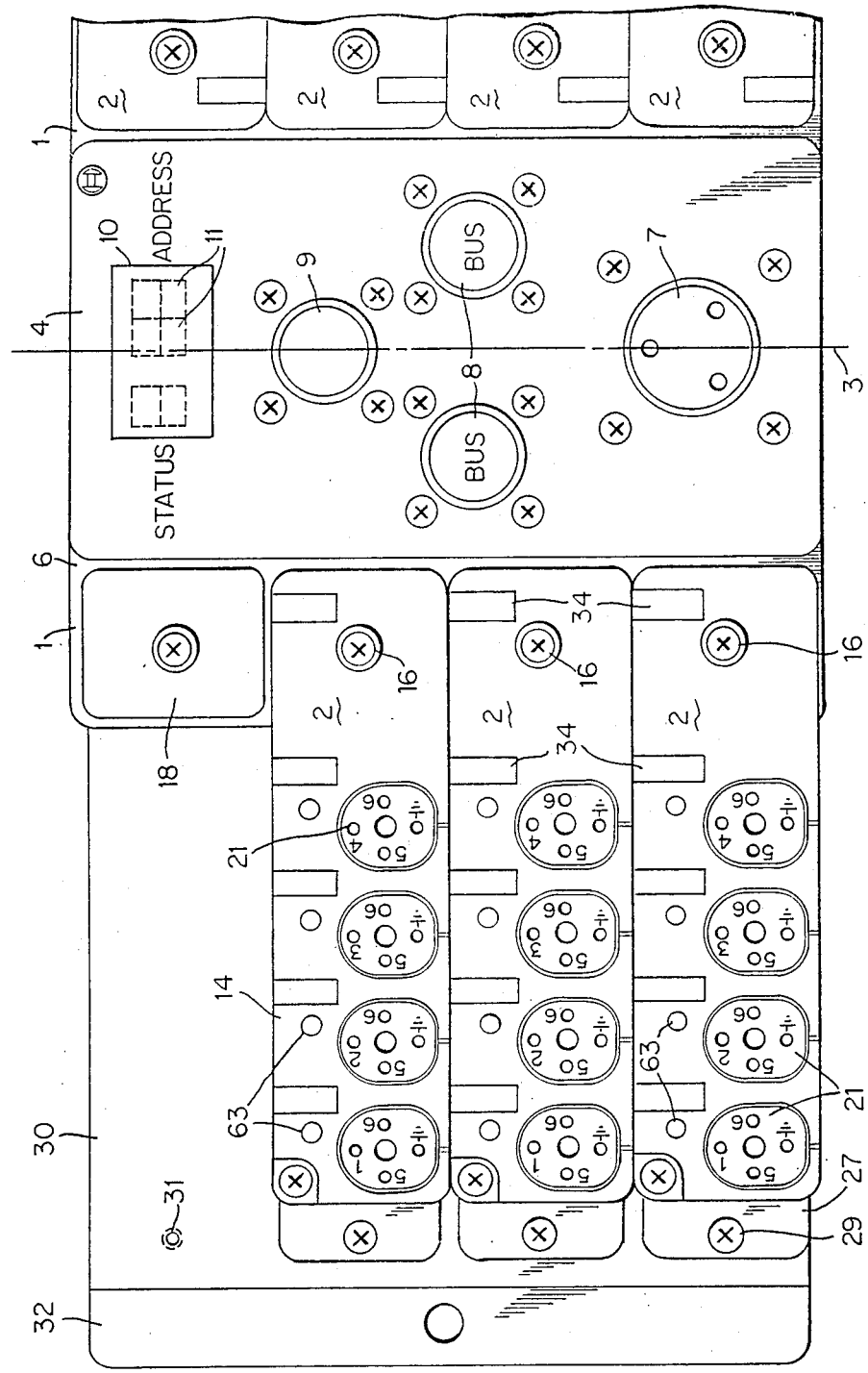
FIG. 1 is a plan view of an input/output group of the present invention.
Figure 2:
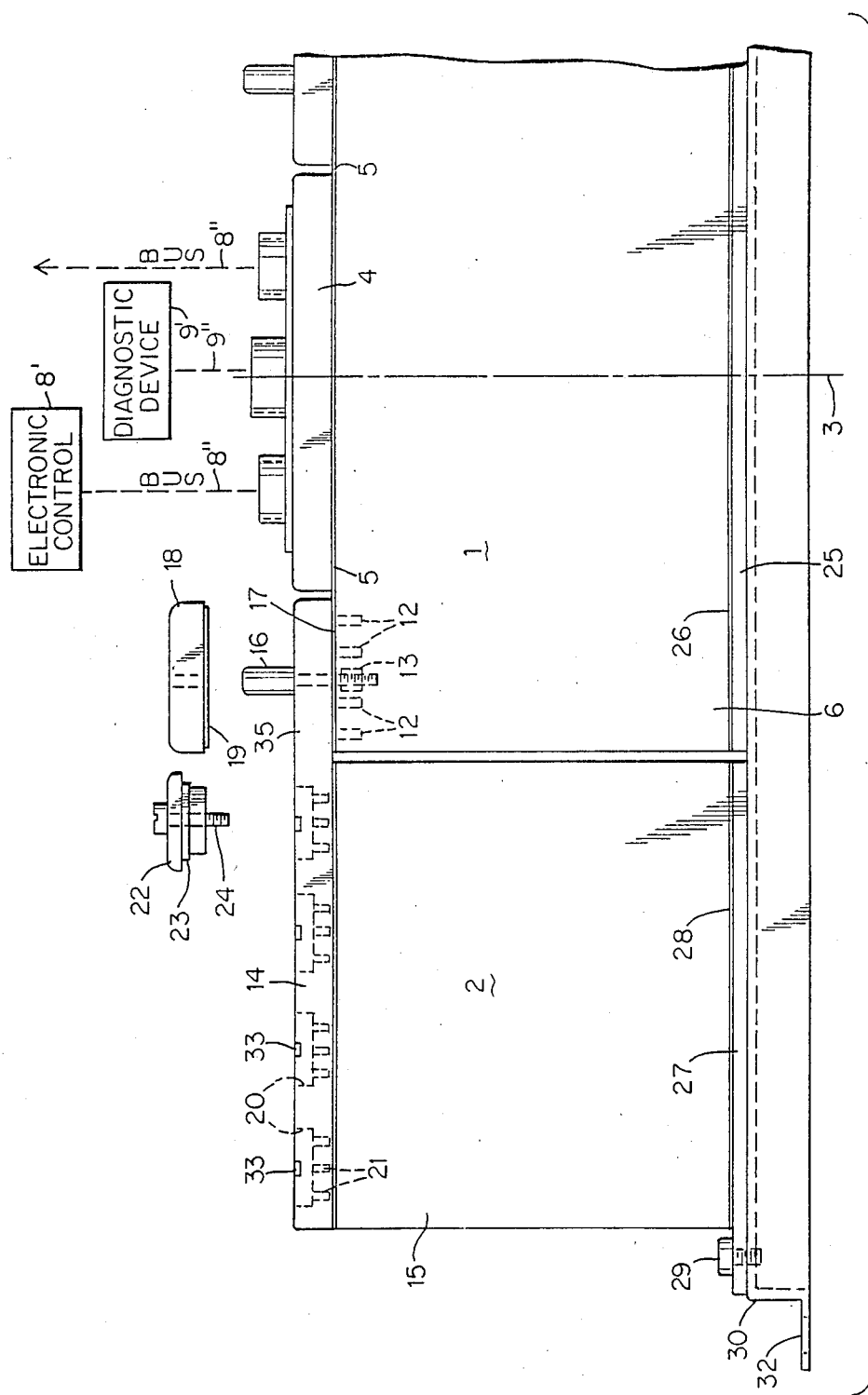
FIG. 2 is a side view of the input/output group of FIG. 1.

FIGS. 1 and 2 illustrate an input/output group with a plug distribution box 1 in the middle and insertable input/output modules 2 which can be secured, in an easily replaceable manner, mirror symmetrically about a centerline 3 on both sides of plug distribution box 1. As shown in FIG. 2, plug distribution box 1 has an upper cover plate 4, which is screwed to a housing 6 with an intervening sealing layer 5.

As shown in FIG. 1, there are provided, in the lower portion of the cover plate, a 3-poled plug socket 7 for power supply, in the middle portion, two further plug sockets 8 for buses 8", e.g. to an electronic control unit 8' and a 4-poled plug socket 9 for a cable 9" to a diagnostic device 9'. Water-tight, screw-securable plugs (not shown) are placed in these sockets or, when no connection is to be made, the free terminals are sealed with a corresponding cover cap, especially in the case of the diagnostic terminal 9. In the upper portion, an opening 10 is provided for installing a display device 11 which displays, for example, the addresses of the input or output stages and the associated status. The opening panel 10 is sealed water-tight with a clear sightglass.

To each side of cover plate 4, there is a row of four multi-pole sockets 12 (FIG. 2), each of which has in its center a threaded hole 13. Into these sockets, one may plug, on each side, four input/output modules 2. FIG. 1 shows four modules on the right side and three modules on the left side. The plugs or prongs for this purpose are located on the underside of an extension 35 (FIG. 2) from the narrow side of housing 15 of each input/output module 2. The extension is covered by an upper cover 14 on housing 15. A knurled-headed screw 16 passes through the middle of this extension and engages in threaded hole 13, thereby forming part of the securing means for input/output module 2. Tightening this screw 16 presses a portion of extension 35, which surrounds prongs 12, onto a seal 17, which can be a portion of the seal 5 for the cover plate 4.

If a socket for an input/output module 2 is not used, the socket is covered with a blank or blind cap 18, as shown in FIG. 1 next to the upper left corner of cover plate 4. As shown in FIG. 2, cap 18 can be provided with a bead 19 circumscribing the socket and a screw fastening, which bead can press down to form a water-tight closure. A similar bead can be provided at the corresponding place on the underside of extension 35 of the input/output modules.

Each cover plate 14 of an input/output module 2 is formed with a row of four recesses 20 which each accomodate a socket 21 for receiving a plug (not shown) from one of the reporting, positioning, or measuring units. These sockets 21 are internally connected with the input/output stages of these modules. If one of the sockets 21 is unused, it is closed with a cap 22 which may have, for example, an O-ring 23 and screw 24 to form a water-tight closure. A seal for the plugs for socket 21 can be achieved by similar means. At the bottom of housing 6 of box 1, a heat sink or radiator plate 25 is mounted, which is in heat-conductive relation with the power components inside, e.g. power transistors. The broken-through portions of the housing floor are sealed by a further seal 26. In a similar fashion, each housing floor of the input/output module 2 has a radiator plate 27 and a seal 28. This radiator plate 27 projects, beyond the housing floor, from the outer narrow side far enough to provide room for a securing screw 29, as shown at the lower left of FIG. 2. Screw 29 is easily accessible from above, thereby facilitating simple assembly and replacement of an input/output module 2 using the securing screws 16, 29.

For easier assembly of the complete input/output group, housing 6 of distribution box 1 and all input/output modules 2 are mounted on a chassis or assembly frame. This chasis 30 has threaded bores 31, as shown at upper left of FIG. 1, for external securing of the input/output modules 6. Chassis 30 also has cut-outs under housing 6 of distribution box 1, through which housing 6 is fastened from below onto the chassis 30. On each side of chassis 30, mounting flanges 32 project out for securing the chassis onto the machine or installation. This attachment can be achieved by a respective securing screw on each side or, if necessary, at all four corners by a vibration-damping or other insulating securing means, in the event that severe vibrations at the securing site are to be expected. The securing means may be electrically conductive. An electrically conductive securing means can serve a protective function, e.g. by intercepting electromagnetic noise or the like.

Figure 3:
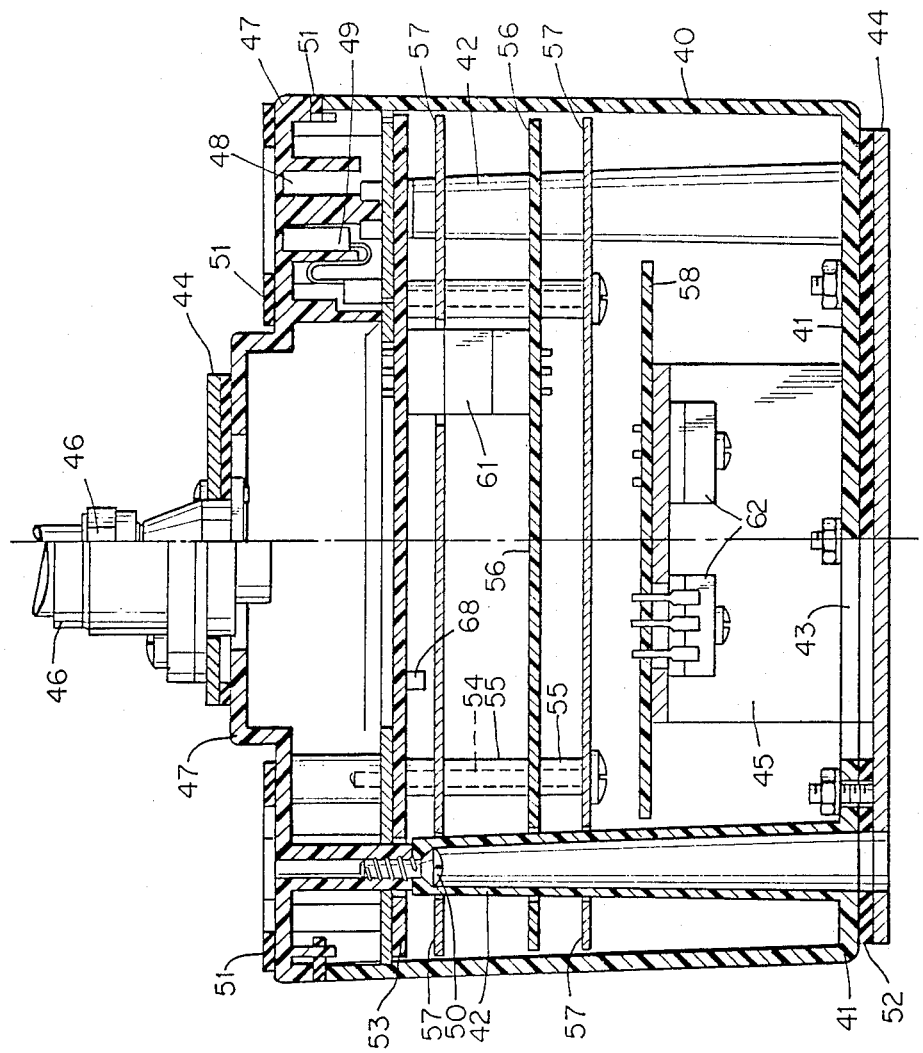
FIG. 3 is a cross-sectional view of a plug distribution box.

FIG. 3 illustrates a plug distribution box 1, sectioned at different places. The housing 40 corresponding to housing 6, of FIG. 1 injection molding part, whose base or bottom 41 is formed with downwardly-open securing wells 42. Base 41 also has a large perforation or break-through 43. through which is fed a heat conductive sheet 45 connected to radiator plate 44. Cover element 47, which supports the sockets 46, is similarly a plastic injection molding, formed with chambers 48 which hold the spring contacts 49 of the sockets for the input/output modules. Screws 50 in securing wells 42 secure cover element 47 to housing 40. Water-tight sealing is assured by circumferential rubber rings 51 or soft rubber sheets 52.

Under cover element 47, there is provided a printed circuit board 53, onto which all terminals of the socket are soldered and through which further connections are made. Additional boards are mounted at intervals by means of securing bolts 54 which pass through tubular spacers 55. These boards preferably include a printed circuit board 56 for the logic components, flanked by a pair of shielding boards 57 which shield logic board 56 above and below. For external shielding, the inner wall of housing 40 can be provided with a shielding coating (not shown) or the molding can be done using an electrically conductive material. A further, power-supply, board 58, and a cooling body of the power semiconductors 62 of this power supply, are fastened to the heat-conductive sheet 45 connected to the radiator plate 44.

Depending upon the expected environmental influences at the installation site, further structural measures can be taken to minimize damage from penetrating moisture. For example, hygroscopic material can be placed in a chamber of the cover element, or a filter or valve for pressure relief can be put in a perforation in radiator plate 44, or a direct membrane can be provided which equalizes pressure by osmosis, or a moisture sensor 68 can be provided on circuit board 53 for generating an error signal in the event of wetting or excessive humidity.

The electrical connections between printed circuit (PC) boards can be carried out by multi-prong connectors, as shown at 61 between PC board 53 for distribution terminals and PC board 56 for logic components, or flexible conductors can be provided to connect the PC boards.

Figure 4:
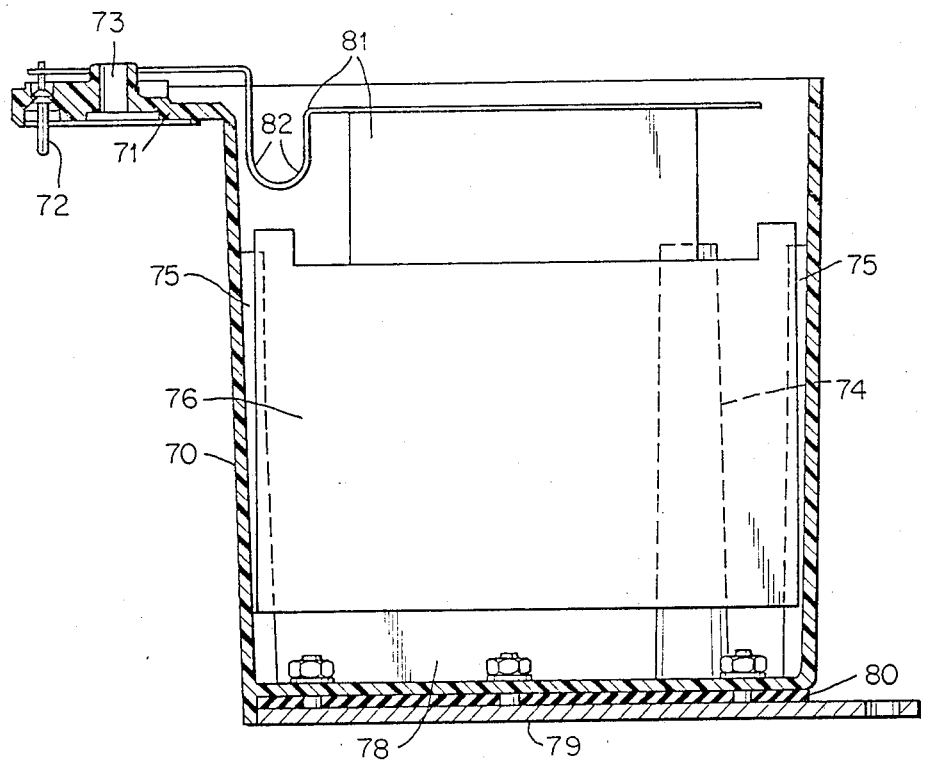
FIG. 4 is a cross-sectional view of an input/output module.
Figure 5:
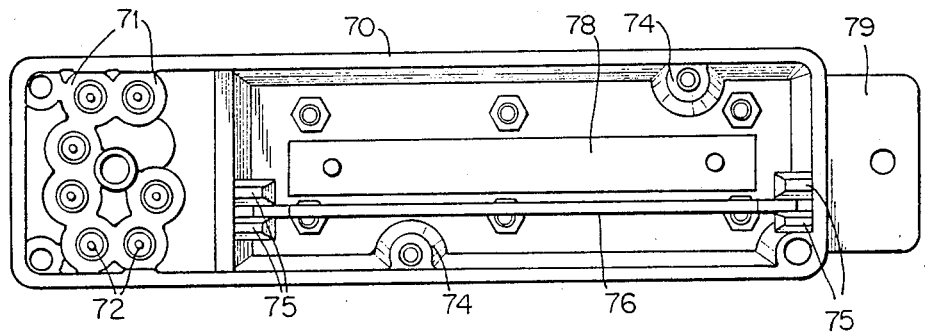
FIG. 5 is a plan view of the input/output module of FIG. 4.

FIGS. 4 and 5 respectively show an input/output module, in section, and in top view, without the cover 14 shown in FIG. 2. Housing 70 comprises an injection-molded plastic with a metallic shielding on the housing's inner wall. The upper end has an extension 71 projecting from the narrow side. Terminal prongs 72 for insertion into the plug distribution box 1 are provided on extension 71. A break-through or perforation 73 is provided to accomodate the attachment screw 16 shown in FIG. 1. The housing has, on each broad side, an outwardly opening securing well 74 which serves for securing the upper cover 14, as shown in FIG. 2. On the inner housing wall, on each of the narrow sides, a pair of detents or ridges 75 are formed, between which a PC board 76 can be slid. On this PC board 76 are arranged the electronic circuits for amplification, processing, and/or display of the input/output signals. The power-output-stages of the four inputs/outputs are in heat conductive relation with a heat conduction sheet 78, which is attached through an aperture in the housing base with the radiator plate 79 secured there. The sealing against the outside is again carried out by means of a soft rubber sheet 80. The electrical connection of the components on the PC board 76 with the terminal prongs 72 and the sockets 21 on cover plate 14 is accomplished by means of tracks on a flexible conductor strip 81, onto which the terminals are soldered and which is shaped with curves 82 for easier assembly. The display can be by LEDs (Light Emitting Diodes) which are, like the terminals of sockets 21, soldered onto the flexible PC board, and are visible through transparent but water-tight panels 63 shown in FIG. 1.

The structure thus described makes it possible to easily install, check, and/or replace an input/output module. It is often necessary to match the power, current, or voltage of the input/output stages to the reporting, positioning, or measuring units of the installation. Input/output modules which differ internally from one another can be selected and mixed as desired for plugging into the plug distribution box 1, that is, a simple modular structure is made possible.

There is also the possibility of designing the individual stages or modules in such a manner that they can be used as either input or output stages. However, this requires an additional investment in circuitry and/or results in the stages having a less-than-optimal layout. With the input/output structure of the present invention, such double use is not necessary, since by selecting modules, one can choose at will the desired respective numbers of input modules and output modules. One can choose modules with 4 input stages, 4 output stages, or even modules with 2 input and 2 output stages.

In some installations or machines, the processing of analog signals is necessary. One can provide modules which process analog input signals, that is, upon receipt of predetermined or adjustable signal levels, generate corresponding digital signal outputs, or which feed the analog input signals through an A/D (analog-to-digital) converter and forward the resulting digital signals over the bus to the CPU. In similar fashion, output modules can be so constructed that they convert digital signals into analog values and feed these to the machine or installation for control purposes.

The opportunity to connect a diagnostic device directly to the plug distribution box permits, in case of a fault, carrying out a more comprehensive diagnostic procedure, which, with the aid of the logic component, enables extending fault detection to the individual reporting, positioning, and measuring units. For easier identification of the individual sockets, one can provide slots 33, as shown in FIG. 2, into which identification strips 34 (FIG. 1) can be slipped and clamped.

The modules (2) may have inputs and/or outputs constructed according to a technology which is different from the electrical, for example hydraulics, fiber optics and pneumatics.

It will be apparent to those skilled in the art that numerous variations of the foregoing embodiments are possible within the scope of the inventive concept. In particular, features of one embodiment may be combined with features of another of the foregoing embodiments.

What is claimed is:

1. Decentralized modular input/output unit adapted to be located in the immediate vicinity of a machine or controlled device and
   additionally adapted for electrical connection to an electronic control unit (8'), especially a programmable memory control for the machine or controlled device, via a connecting bus (8")
   in combination with
   at least one electronic input/output module (2),
   wherein said at least input/output module includes an input/output stage (77) and a connection plug means (71, 72 73), and
   wherein said modular input/out unit comprises
   a distribution box (1);
   at least one bus socket (8) in said box adapted for electrical and mechanical connection of said connecting bus (8"), with said box (1),
   a plurality of further sockets (12) in said box for receiving the connection plug means (71, 72, 73) of at least of one of said input/output modules;
   an electronic logic component (56) shielded with respect to external environmental influences and electrically connected to said at least one bus socket (8) and to said plurality of further sockets (12), located within said box, said logic component (56) controlling the distribution, exchange and interchange of signals between said control unit (8') and said at least one input/output module (2); and
   means (5, 17, 28, 52) for sealing the distribution box (1), said bus socket (8) and said plurality of further sockets (12) against contamination, or ingress of at least one of: dust, moisture, water.

2. Unit according to claim 1,
   further comprising
   a power supply terminal (7) in said box for supplying power to said logic component; and
   at least one input/output module (2) plugged into one of said further sockets (12) and drawing its power from said box.

3. Unit according to claim 1, wherein said box (1) has a top cover plate (4) in which all of said sockets (7, 8, 9, 12) are arranged and
said sockets are adapted to receive said bus (8") and the connection plug means (71, 72, 73) inserted from above.

4. Unit according to claim 1, wherein
said box (1) has a top cover plate (4) in which, at least along an outer periphery thereof, a row of substantially identical further sockets (12, 48, 49) are provided for selective connection of said at least one input/output module (2).

5. Unit according to claim 1, wherein
said box (1) has a cover polate (4, 47) and said at least one bus connection socket (8) is located in a middle portion of the cover plate.

6. Unit accoring to claim 1, wherein
said box (1) has a cover plate (4, 47) and
at least one further connection socket (9) is provided, located in a middle portion of the cover plate for connection of a diagnostic device (9'), and connected to said logic component (56).

7. Unit according to claim 1, wherein
said box (1) has a cover plate (4, 47), and
a display device (11) is provided connected to said logic component (56) for display of at least one of: the status of an input/output module (2) and the address of said input/output module.

8. Unit according to claim 1, including
a circuit board (53) having said logic component (56) thereon, mounted in said box (1).

9. Unit according to claim 8 wherein said circuit board (53) extends parallel to wall of said box;
said at least one bus socket (8) and said further socket (12) being electrically connected to said circuit board; and
connection means (61) connecting said electronic component (56) to said circuit board.

10. Unit according to claim 9, including
a pair of shielding plates (57) mounted in said box, one on each side of said logic component (56).

11. Unit according to claim 1, wherein
a lower portion of said box contains a power supply means having heat-generating components (62) therein;
and a radiator plate attached to said box, said components being mounted in heat-conductive relation to said radiator plate (44).

12. Unit according to claim 11, wherein
said radiator plate (25, 44) is fastened to a base portion (41) of said box, and a heat-conductive sheet passes through an aperture (43) in said box and conducts heat from said components (62) to said radiator plate (25, 44).

13. Unit according to claim 1, wherein
a power supply circuit board (58) is provided, mounted in said box (1) parallel to a top wall thereof (47) thereof and power supply means (62) are mounted on said power supply circuit board.

14. Unit according to claim 1, wherein
a plurality of said modules (2) are provided located outside said box and are connected mechanically and electrically to said box by means of plug-and-socket connections formed by the connection plug means (71, 72, 73) and the further sockets (12).

15. Unit according to claim 1, wherein the at least one module (2) has an upper cover plate (14) formed with a row of module sockets (21) for connection with at least one of: a reporting unit, a positioning unit, a measuring unit of a machine or device.

16. Unit according to claim 15, wherein
each module (2) comprises a narrow housing (70), and circuit means for at least one of: input, output amplification, processing of signals are located in said housing and connected to said plug means (71, 72, 73) and additionally to said sockets (21).

17. Unit according to claim 15, wherein each module (2) has a removable cover (14); and
a flexible circuit strip (81) connecting said connecting plug means (72) and said module sockets (21) is provided with said cover, whereby the cover (14) of the module may be removed without unsoldering connections.

18. Unit according to claim 1, wherein each module (2) has a narrow side formed with an extension (35, 71) said connection plug means including prongs (72) for electrical connection to said box (1) and a screw connector (16) on said module for mechanically securing the module to the box.

19. Unit according to claim 1, wherein
each module comprises a housing (70);
power semiconductors located in said housing; and
a radiator plate (27, 79) connected through a heat-conductive sheet (78) with the power semiconductors.

20. Unit according to claim 19, wherein said radiator plate (27) is secured to the base of individual modules (2), has an end extending beyond said bases, and is formed with means for accepting an attachment element (29) for attachment to said box (1).

21. Unit according to claim 1, wherein a plurality of modules are provided,
said modules (2) each have housings (70) which nest against one another and permit plugging a plurality of modules into said box along at least one side thereof.

22. Unit according to claim 1, wherein
a plurality of modules are provided which are outwardly similarly shaped but internally differently configured or connected, said modules being plugged into respective further sockets (12) of said box.

23. Unit according to claim 1, wherein
a plurality of modules are provided, at least one having inputs or outputs constructed according to technology selected from the group consisting of hydraulics, fiber optics, and pnuematics.

24. Unit according to claim 1, further comprising
a chassis (30) supporting said box (1) and modules (2) and having means (29) for securing an extending flange (27) of said modules to said chassis.

25. Unit according to claim 1, further comprising a plurality of receptacle socket means (21) thereon, and
means (33, 34) on each module for identifying individual sockets (21) thereof, said sockets being arranged in substantially the same plane.

26. Unit according to claim 1, further comprising (FIG. 2) cover caps (18, 22) dimensioned and shaped to fit over and seal unused sockets (8, 12) against at least one of dust, moisture and water.

27. Unit according to claim 1, further comprising
means formed in said box and/or modules for equalizing internal and ambient pressure without admitting ambient dust and moisture.

28. Unit according to claim 1, further comprising a moisture sensor (68) in at least one of: said box (1), said at least one module (2) for generating a malfunction signal upon detection of excessive moisture.

29. Unit according to claim 1 in combination with a set of a plurality of modules in which the respective ones of the modules, each, include selectively, a plurality of input stages, and optionally four input stages, or a plurality of output stages, and optionally four output stages.

30. Unit according to claim 1, wherein said at least one input/output module forms part of a set of a plurality of modules, and at least one of said plurality of modules has a plurality of stages therein of which half the stages are input stages and half are output stages, and optionally two input stages and two output stages.

31. Unit according to claim 1, wherein said at least one input/output module processes analog signals and is optionally responsive to predetermined signal levels.

32. Unit according to claim 1, wherein said at least one of the input/output modules is responsive to analog input signals and includes analog/digital conversion means for providing digital output signals at said connecting plug means (71, 72, 73).

33. Unit according to claim 1, wherein said at least one module comprises module sockets (21) thereon adapted for connection to the machine or device;

and said at least one module includes digital/analog conversion means for receiving digital signals at said connecting plug means (71, 72, 73) and providing analog signals at said module sockets (21).

34. Unit according to claim 1, wherein said distribution box (1) includes two bus sockets (8) for connection of an additional connecting bus (8").

* * * * *